Figures 1A, 1B:
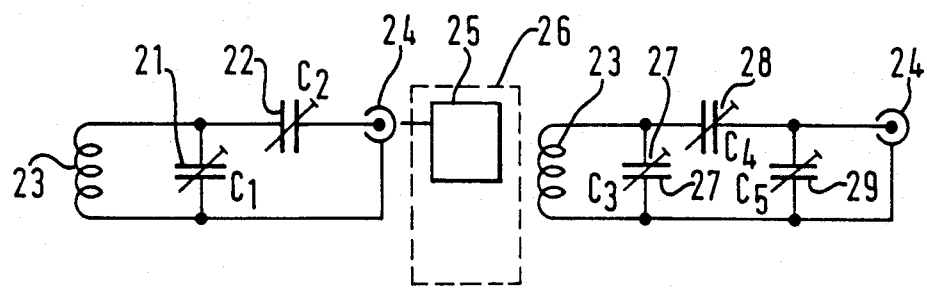

United States Patent [19]

Timms

[11] Patent Number: 4,621,237

[45] Date of Patent: Nov. 4, 1986

[54] RADIOFREQUENCY TRANSDUCER AND METHOD OF USING SAME

[75] Inventor: William E. Timms, Eynsham, United Kingdom

[73] Assignee: Oxford Research Systems Limited, Coventry, England

[21] Appl. No.: 589,104

[22] PCT Filed: Jun. 27, 1983

[86] PCT No.: PCT/GB83/00160

§ 371 Date: Feb. 27, 1984

§ 102(e) Date: Feb. 27, 1984

[87] PCT Pub. No.: WO84/00214

PCT Pub. Date: Jan. 19, 1984

[30] Foreign Application Priority Data

Jun. 28, 1982 [GB] United Kingdom ................. 8218690

[51] Int. Cl.[4] ........................................... G01R 33/20
[52] U.S. Cl. ..................................... 324/322; 324/318
[58] Field of Search .............. 343/741, 742; 333/24 C, 333/24 S; 324/300, 307, 318, 319, 322

[56] References Cited

U.S. PATENT DOCUMENTS

| 2,116,734 | 5/1938 | Reinartz | 343/741 |
| 3,184,746 | 5/1965 | Chatelain | 343/742 |
| 3,402,346 | 9/1968 | Baker . | |
| 3,783,419 | 1/1974 | Lafond . | |
| 4,095,168 | 6/1978 | Hlavka | 324/322 |

OTHER PUBLICATIONS

Lowe et al, "A Fast Recovery Pulsed Nuclear Magnetic Resonance Probe Using a Delay Line", Rev Sci Instrum, vol. 45, No. 5, May 74, pp. 631-639.

Primary Examiner—Michael J. Tokar
Attorney, Agent, or Firm—Cushman, Darby & Cushman

[57] ABSTRACT

A radiofrequency transducer, for nuclear magnetic resonance spectroscopy, comprising a radiofrequency transmission line formed into a loop, having terminals for the connection of a radiofrequency source or receiver thereto in such a manner that the transmission properties of the loop counteract the impedance due to its loop geometry. The transducer may comprise first and second elongate conductors (1,2) spaced by a dielectric material (3), for example polytetrafluoroethylene, and shaped to form the said loop, terminals (4,5) for the two conductors being provided at opposite ends of the loop.

17 Claims, 11 Drawing Figures

RADIOFREQUENCY TRANSDUCER AND METHOD OF USING SAME

The present invention relates to a radiofrequency transducer and is concerned in particular, but not exclusively, with the use of such a transducer in conjunction with a known technique of nuclear magnetic resonance.

Nuclear magnetic resonance (NMR) is a well known laboratory technique, which can be used, inter alia for the determination and characterization of chemical species. In the classic NMR experiment, a substance is subjected to a static magnetic field ("B") and an oscillatory electromagnetic field of angular frequency $\omega$. A condition of resonance occurs when $\omega = \gamma B$, where $\gamma$ is the gyromagnetic ratio which is characteristic of a particular nucleus present in the substance. Although the oscillatory field is normally and electromagnetic one for practical reasons, it should be pointed out that it is only the magnetic component which interacts with the test substance to produce the NMR effect. The resonance condition can be detected by absorption of, or absorption and re-emmission of, the radiofrequency field applied, and is indicative of the presence of a particular element comprising that nucleus. In general, the way of coupling the radiofrequency source to the particular substance has been to provide a simple loop or coil transducer, designed to generate a radiofrequency magnetic field connected to the RF source by a coaxial cable or other type of RF transmission line.

It is necessary to tune the coil so as to be resonant at the required frequency for the particular nucleus under investigation at the particular magnetic field employed, and to match the impedance of the coil to that of the transmission line (eg. coaxial cable) employed. Examples of typical circuits for tuning and matching are shown in FIGS. 1a and 1b, which will be described in more detail hereinafter. These are the well known "half-T" and PI networks respectively.

At the high frequencies commonly used in NMR techniques, very low values of variable capacitors are required in the arrangement shown in FIGS. 1a and 1b for capacitors C1 and C3, to successfully tune and match the simple coil. In particular, when large coil sizes are employed, for example loops greater than 5 cm or so, and at high field strengths, for example of 1.5 Tesla and above, the stray capacitances of the coil become significant compared with the values required to tune and match the coil. The self capacitance of the coil is even more significant if the sample being analyzed is conductive, or if it has a high dielectric constant. Under these conditions, the tune and match methods become inefficient and unworkable. This is particularly true for so-called "surface coils" for example of the kind suggested by J. J. H. Ackermann et al (Nature 283,167 (1980)), which are often used in medical and other in vivo applications in which there is physical difficulty in locating the sample at the centre of a loop transducer.

Figure 2:
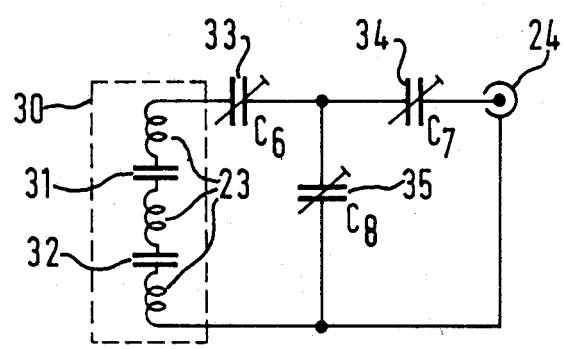

One method of overcoming this problem has been to introduce into the region of the coil one or more series capacitors to lower the effective inductance of the coil. An example of such a solution is that proposed by D. W. Alderman and D. M. Grant (J. Magn. Res. 36, 447, (1979)). As well as reducing the effective inductance of the coil, the introduction of series capacitance in this way means that the high RF voltages employed are divided across more components. A schematic diagram of such an arrangement as shown in FIG. 2, which will be described in more detail hereinafter.

A difficulty with such proposals has been that they are relatively fragile and prone to break when applied to large rf coils.

It is an object of the present invention to provide a radiofrequency transducer, particularly but not exclusively for use in nuclear magnetic resonance techniques, which overcomes or reduces the problems set out above where a relative large coil size is utilised at high frequencies and the stray capacitances of the coil become significant compared with the capacitance values required to tune and match the coil to a source or receiver.

According to the present invention in one aspect there is provided a radiofrequency transducer comprising a radiofrequency transmission line formed into at least one loop, means being provided for the connection of a radiofrequency source or receiver thereto in such a manner that the transmission properties of the loop counteract the impedance due to its loop geometry.

It has now been found, at least in preferred embodiments of the invention that the problem of tuning and matching relative large RF coils can be overcome by constructing an RF transducer loop as in effect an RF transmission line, in which additional self capacitance is provided, distributed relatively uniformly around the loop. This may be achieved by providing a loop made from first and second elongate electrical conductors spaced by dielectric material. The radiofrequency signal source can be applied to the conductors by means of connectors at opposite ends of the conductors, whereby the effect of series capacitance is provided, which has the effect of lowering the inductance of the loop. This capacitance is distributed relatively evenly around the loop.

In accordance with one main aspect of the present invention there is provided a radio frequency transducer comprising a radio frequency transmission line formed in a configuration including at least one loop, said transmission line comprising at least first and second elongate conductors spaced by dielectric material, and connection means for connecting the transmission line to a radio frequency source or receiver, the connection means comprising first connection means for the said first conductor and second connection means for the said second conductor, the connection means for the first conductor being provided at one end of the loop and the connection means for the second conductor being provided at the other end of the loop.

In some particularly preferred forms of the present invention it is arranged that in the loop (or in each loop of a plurality of loops) of the transmission line at least one of the conductors has a connection means coupled to it at one end of the loop and has an open circuit at the other end of the loop. In some preferred forms it is arranged that in the loop each of the conductors has a connection means coupled to it at one end of the loop and has an open circuit at the other end of the loop.

However in alternative arrangements, it may be arranged that in the loop at least one of the conductors has a connection means coupled to it at one end of the loop and has a selectively variable impedance component at the other end of the loop, for example a selectively variable capacitor. Such a variable capacitor allows an extension of the normal working range of the transducer over which a suitable tune and match capacitive network may couple the loop to an NMR spectrometer, as will be described in more detail hereinafter.

In many applications it will be preferred that the transducer comprises a single loop, but in many cases two or more loops may be provided. For example in one configuration the transmission line may include two or more loops arranged substantially parallel to each other and spaced apart in a direction perpendicular to the planes of the loops.

In one preferred arrangement the transmission line is formed in a configuration including two connected loops, the said connection means being provided at a junction between the two loops, the arrangement being such that the first connection means for the first conductor is provided at one end of one loop and the second connection means for the second conductor is provided at the other end of the said one loop, the arrangement also being such that the first connection means for the first conductor is provided at one end of the other loop, and the second connection means for the second conductor is provided at the other end of the said other loop.

It is particularly preferred that the transmission line may be formed with two loops arranged in a Helmholtz coil configuration with the loops approximately circular and spaced apart along a common axis, the axial spacing of the two loops being substantially equal to the mean radius of the loops. Such an arrangement gives a particularly uniform magnetic field.

It is to be appreciated that more than two loops may be provided in a parallel configuration, such as has been set out above, for example a third loop may be provided mid way between the said two loops, and may also be connected electrically in parallel with the first two loops, to the first and second connection means in corresponding manner. In other arrangements additional loops may be added in various configurations depending upon the function required, for example additional turns may be added to the said two loops, provided this meets the functional requirements.

In other arrangements the transmission line may be formed in a configuration including two or more consecutive loops, the connection means for the first conductor being provided at one end of the series of loops, and the connection means for the second conductor being provided at the other end of the series of loops. For example the series of loops may comprise a helix with the connector means connected at opposed ends of the helix.

It will normally be preferred that the loop is a substantially complete loop with the said ends of the loop in close proximity to each other and with the said connection means for the conductors of the loops in close proximity to each other.

By way of example, said at least one loop may be substantially circular and, where there are two or more loops, the loops may be coaxial. In other arrangements each loop may have a rectangular configuration. In some arrangements, each loop may lie on a cylindrical surface and may have a configuration in that surface such that a developed view of the surface shows the coil as having a rectangular configuration.

Although in many arrangements the transmission line of the transducer will have only first and second spaced apart elongate conductors, in other arrangements three or more conductors may be provided. In particular, the transmission line may comprise first, second and third elongate conductors spaced by dielectric material, said first connection means being connected to said first and third elongate conductors.

According to another aspect of the invention, there is provided a radiofrequency transducer, for example an r.f. radiator or probe comprising first and second elongate electrical conductors spaced by a dielectric material and formed into at least one loop, means being provided for the connection of a radiofrequency signal source to each of the said conductors, the connection means for the second conductor being provided at an end of the said at least one loop opposite the connection means for the first conductor. The two electrical conductors are preferably substantially uniform and the arrangement is such that the distribution of capacitance between the conductors around the loop is substantially linear. This arrangement minimizes point-to-point voltages around the loop, and thereby gives rise to lowered dielectric and conduction losses.

The rf transducer coil according to the invention should be thought of as a so-called "transmission line" and its properties predicted using conventional transmission line theory. The transmission properties of the loop thus can be arranged to counteract the inductive impedance of its coil geometry. Preferably the transmission line is an assembly of conductors and insulation material which have predictable and uniform radiofrequency properties in the required frequency range and which can be used to carry rf power. The properties of such a transmission line are not a simple sum of the "point" static properties.

Analysis of the dynamic behavior and transmission properties can be found in sources such as "Microwave Transmission Design Data", Theodore Moreno, Dover edition 1958; library of Congress Catalogue Card No. 58-11278. This reference also analyzes the effects of non-uniformity of the transmission line thus indicating the degree of uniformity required at any selected operating frequency.

A simple introductory analysis can be found in standard text books such as "Electricity and Mangetism", B.I. and B Blearey, OUP 1965.

The transducer preferably comprises a single loop or turn, although for certain applications multiple turns may be desirable.

The dielectric material preferably has very low loss, and the material of choice is polytetrafluoroethylene (PTFE), or a glass laminate incorporating PTFE.

The loop may be thought of in its simplest embodiment as at least two conductors spaced by a uniform amount over their length, formed into a loop, and connected at opposite ends to a tuning and matching circuit. In alternative embodiments, three or more spaced conductors may be utilized. When more than two conductors are used, sets of conductors may be connected in parallel.

The conductors may be formed simply from an appropriate length of coaxial cable, or indeed from two suitable supported strands of wire provided with appropriate connections provided that the rf transmission line properties are suitable. However, in a preferred embodiment, the coil comprises a pair of copper strips separated by PTFE tape or like material, the opposite ends of the strips serving to provide the connection means. In an alternative preferred embodiment, the conductors may be provided in the form of copper or the like laminate disposed on opposite surfaces of a dielectric sheet. Such a radiator may be formed, for example, by etching a suitable double- sided copper clad laminate board.

In addition to copper, the conductors may be made of silver, gold or any other metal whose magnetic susceptibility lies between approximately $-10^{-4}$ cgs units and $+10^{-4}$ cgs units.

Figure 3:
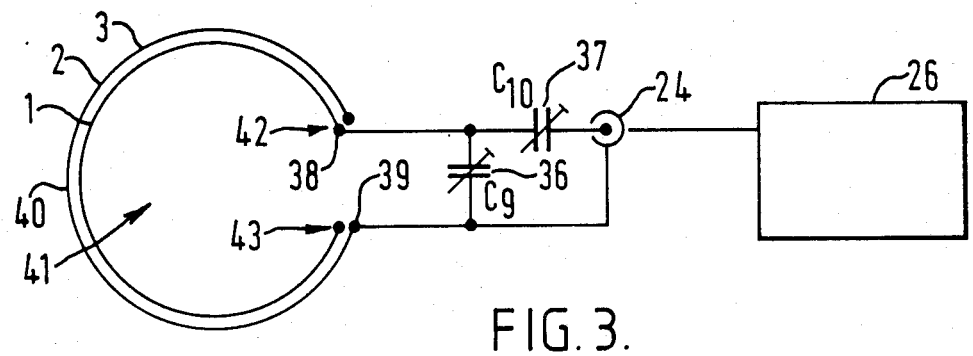

The transducer coil according to the invention may be tuned and matched to the RF source and coaxial cable by a simple "T" network, for example as illustrated in FIG. 3, which will be described in more detail hereinafter. Because the rf source is connected to opposite ends of the conductor, rf current flows completely round the loop in one or other of the conductors. For NMR purposes, this is important, because the current is the source of the rf magnetic field. The distributed capacitance means however that voltages are kept low, which minimizes the electrical component of the radiated field. Thus, a predictable and reasonably uniform rf magnetic field may be generated.

In practice, the transmission line is chosen for best propagation and minimum loss. This is not necessary for the application to work but is necesasry for optimum performance. Optimum performance is obtained when the quality factor, Q, of the resonant tuned and matched assembly is a maximum.

In practice for a particular coil application one would decide the transmission properties by the following considerations:

1. How big is the rf loop to be?
2. What are the practical tune and match capacitors?
3. From the above the required characteristic impedance of the transmission line can be decided.
4. Which type of transmission line will best satisfy step 3, and also give the best quality factor when assembled?
5. For human subjects of the NMR investigation there may also be safety factors to be considered when the transmission line is chosen.

In accordance with a further embodiment of the invention, there is provided a transducer assembly for a nuclear magnetic resonance spectrometer, comprising a transducer as set forth above, and means for connecting the asesmbly to a radiofrequency transmission line, for example a coaxial cable, for providing a connection to the spectrometer, and means including a variable capacitor for tuning the probe assembly to the radiofrequency signal and the said transmission line.

An NMR spectrometer utilizing a probe according to the invention is very useful for in-vivo biochemical measurements, since it is in general important in such measurements for the probe to energize and respond to nuclei at some distance, for example a few cm deep, within the sample. Increasing depth of penetration requires increasingly large transducer coils.

In accordance with a further aspect of this invention, there is provided an NMR spectrometer, comprising a transducer coil as set forth above, or a probe as defined above.

According to yet a further aspect of the invention, there is provided a method of obtaining an NMR spectrum, which method involves the utilization of such an rf transducer coil.

It should of course be appreciated that a wide range of variations of loop geometry are possible within the scope of the invention, for example, if it is desired to provide a non-uniform magnetic field, it may in certain circumstances by desirable to provide a structure in which the two conductors extending parallel over only a portion of the loop, the remainder of the loop being comprised by only one of the conductors.

Embodiments of the invention, and examples of known devices, will now be illustrated with reference to the accompanying drawings, in which:-

Figure 3A:
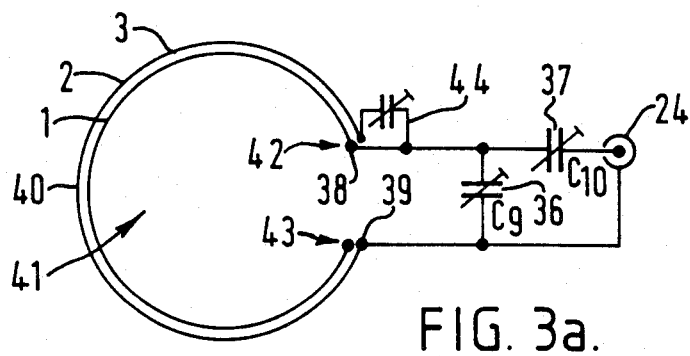
Figure 4:
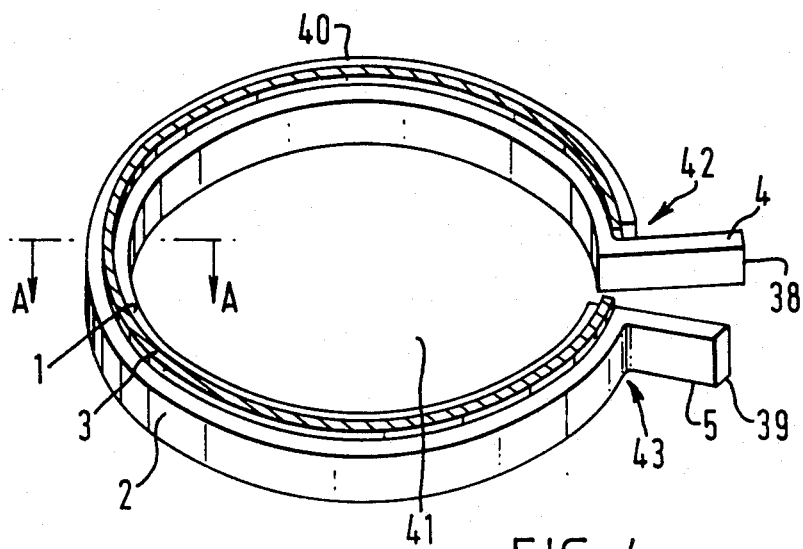
Figure 5:
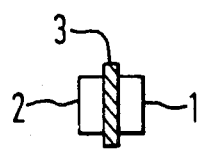
Figure 6:
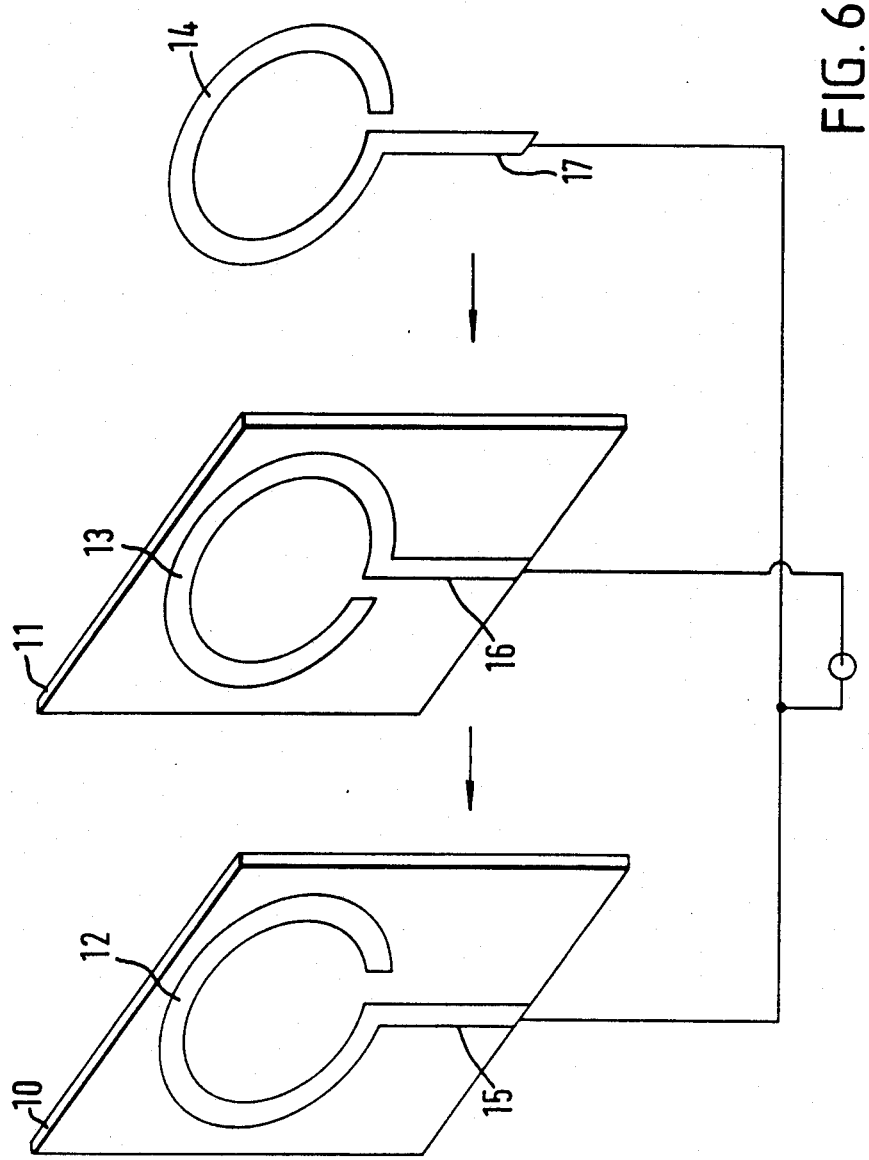
Figure 7:
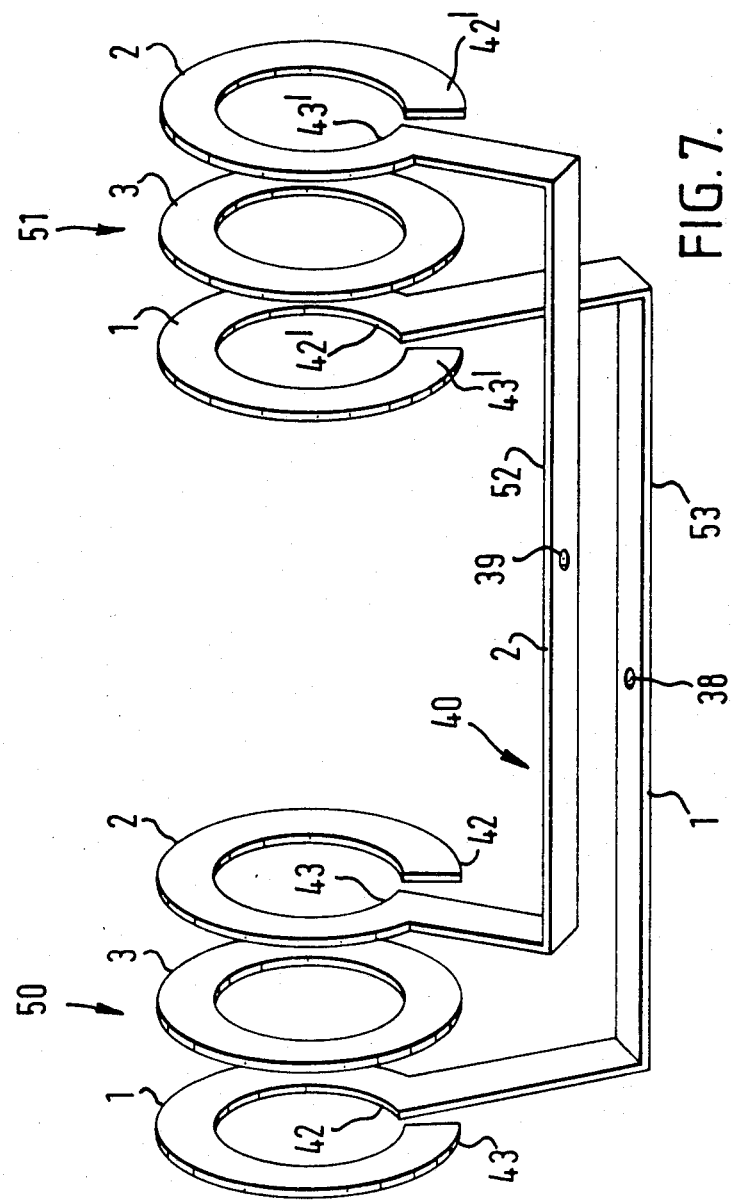
Figure 8:
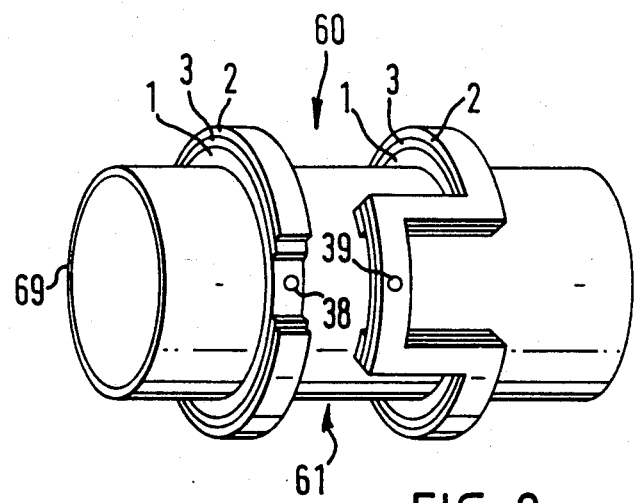
Figure 9:
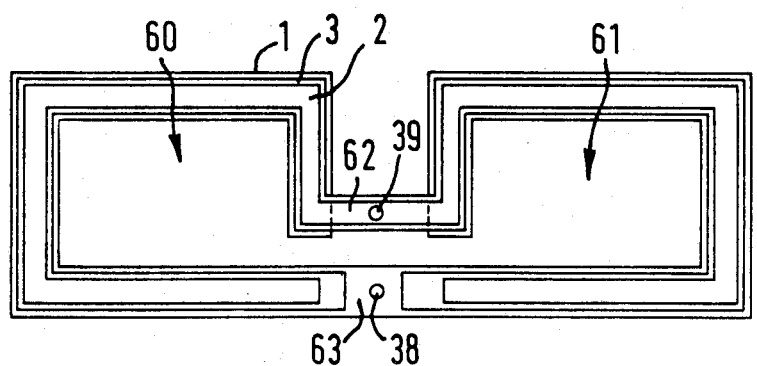

FIG. 1(a) and 1(b) illustrate conventional "T" and "PI" tuning and matching networks, FIG. 2 is a schematic diagram of a conventional arrangement with series capacitors to lower loop inductance, FIG. 3 is a schematic diagram of a transducer according to the invention and FIG. 3(a) shows a modification of such a transducer, FIG. 4 is a perspective view of a particular embodiment of a probe for use in the circuit of FIG. 3, suitable for use in an NMR spectrometer, FIG. 5 is a section on A—A of FIG. 4, FIG. 6 is a schematic diagram of a further transducer according to the invention, FIG. 7 is a schematic diagram in exploded form of a further transducer according to the invention, which in use is arranged in the configuration of a Helmholtz coil;

FIG. 8 is a schematic diagram of a yet further transducer embodying the invention, showing two loops or coils wrapped around a circular former; and FIG. 9 is a developed view of the coil configuration of FIG. 8.

FIG. 1(a) shows a circuit diagram of a conventional "T" tuning and matching network comprising two capacitors 21 and 22, having capacitances C1 and C2 respectively, and connected in parallel and in series respectively across a coil 23, which may be a conventional surface coil for an NMR spectrometer. The tuning and matching network 21, 22 is connected to a transmission line 24, for example a coaxial cable, which leads to a radiofrequency signal source or receiver 25 of an NMR spectrometer indicated generally at 26.

FIG. 1(b) shows a tuning and matching network of the known "PI" kind comprising three capacitors 27, 28 and 29 of capacitances C3, C4 and C5. The capacitors 27 and 28 are connected in parallel and series respectively across a surface coil 23, in the same manner as in FIG. 1(a), and the capacitor 29 is connected in parallel across the series combination of capacitors 27 and 28. The input and output of the tuning network 27, 28 and 29 is again connected across a transmission line 24 which leads to a spectrometer 27 in the same manner as in FIG. 1(a).

It is to be appreciated that although circuits shown in FIGS. 1(a) and 1(b) are known in themselves when the coils 23 are conventional surface coils for NMR work, the circuits of FIGS. 1(a) and 1(b) may be used in accordance with the invention where the coils 23 are replaced by transducers embodying the invention.

FIG. 2 is a circuit diagram of a known form of NMR transducer coil, indicated at 30, in which a number of capacitors, shown in the Figure at 31 and 32, are introduced in series with the coil shown diagrammatically at 23. The transducer coil 30 is linked to the transmission line 24 by three capacitors 33, 34 and 35 having capacitances C6, C7 and C8, the capacitors 33 and 34 being connected in series between the coil 30 and the transmission line 24, and the capacitor 35 being connected in parallel with the coil 30 at the junction of the two capacitors 33 and 34. The additional capacitors 31 and 32 in the coil 30 reduce the effective inductance of the coil and having the added advantage that the high rf voltages are divided across more components. However, such a coilcapacitor structure is mechanical unsound, and may in practice physically break.

There will now be described with reference to FIGS. 3, 4 and 5 an embodiment of the present invention which provides a radiofrequency transducer for use in an NMR spectrometer. FIGS. 4 and 5 show a perspective view of an actual probe, and FIG. 3 shows diagrammatically a form of tuning and matching circuit for the probe.

Referring to FIGS. 4 and 5, a loop for transmitting and receiving a radiofrequency magnetic field comprises a first conductor 1 and a second conductor 2 spaced by a dielectric 3. The conductors 1 and 2 are each formed of a rectangular copper strip approximately 4 mm×1 mm, and are substantially uniform in thickness and spacing over their lengths. The dielectric material 3 is formed of a PTFE material, approximately 0.5 mm in thickness. This may be either machined, to form a firm mechanical shape, or as an alternative, PTFE tape may be used, and wound around one or other of the conductors 1 and 2. It is important to use low loss dielectrics in the region close to the loop, where the electric field is at its highest, and also that the conductors should be of a thickness which is large compared with the RF skin depth of the frequency of choice. A 10 cm diameter coil of the kind illustrated in FIGS. 4 and 5 and having the material dimensions as described above may be tuned and matched using a simple circuit as illustrated in FIG. 3, using variable capacitors 36 and 37, having capacitances C9 and C10 having a range of from 2 pF to 20 pF, at a frequency of 80 MHz. By comparison, a corresponding single turn conventional coil has a capacitance of approximately 5 pF at the same frequency, and cannot therefore be tuned and matched to a 50 Ohm coaxial cable, when used on a sample with high loss.

In the example shown diagrammatically in FIG. 4 and FIG. 3, the radiofrequency transducer comprises a radiofrequency transmission line which is indicated generally at 40, and comprises the first conductor 1, the second conductor 2, and the dielectric material 3 positioned between the conductors 1 and 2. The transmission line 40 is formed into a single loop, indicated generaly at 41. A first connection means 38, for example a terminal, is connected to the first conductor 1 at one end of the loop 41, which end is indicated generally at 42. A second connection means 39, for example a terminal, is connected to the second conductor 2 at the other end of the loop 41, which other end is indicated generally at 43.

In the example shown in FIG. 3, the end of the first conductor 1 which is electrically remote from the first connection means 38 (that is to say which is physically at the end 43 of the loop) is open circuited, and similarly the end of the conductor 2 which is electrically remote from the second connection means 39 (that is to say at the end 42 of the loop 41) is also open circuited.

In FIG. 3(a) there is shown a modification of the arrangement of FIG. 3, in which the only change is that the end of the second conductor 2 which is electrically remote from the second connection means 39 (that is to say at the end 42 of the loop 41) is not open circuited, but is connected to the first connection means 38 through a selectively variable capacitor 44, which for example may be variable in the range 0.2 pF to 10 pF. Such an arrangement permits adjustment of the transmission properties of the loop 41 to account for a wider range of lossy samples, and extends the working range of the transducer. In other arrangements a fixed capacitor may replace the variable capacitor 44, and in yet other arrangements, both ends 42 and 43 of the loop 41 may be terminated by fixed or variable capacitors.

FIG. 6 is a schematic exploded view of a further embodiment of a transducer according to the invention. The transducer comprises two glass-reinforced PTFE boards 10 and 11 providing dielectrics separating three elongate conductors 12, 13 and 14 having a loop configuration. Conductors 13 and 14 are in fact disposed on opposite sides of board 11, but are shown exploded for clarity. In use, boards 10 and 11 are pressed close together so as to provide a uniform sandwich construction. Boards 10 and 11 may advantageously be formed by a chemical etching process using a copper-clad laminate.

Each conductor 12, 13 14 is provided with a leg 15, 16 and 17 respectively forming a terminal for connection to a radiofrequency source or receiver, the leg 16 of middle conductor 13 being at the opposite end of the conductor from that of conductors 12 and 14.

In use conductors 12 and 14 are connected in parallel to one side (the screen) of a coaxial transmission line, conductor 13 being connected to the central conductor.

Turning now to FIG. 7, there is shown a yet further embodiment of a transducer according to the invention, and again FIG. 7 is a diagrammatic representation showing the transducer in exploded form.

The transducer shown in FIG. 7 comprises a transmission line indicated generally at 40 and comprising a first conductor 1 and a second conductor 2, formed in a configuration including two connected loops indicated generally at 50 and 51, connected by linking strips of conductor 52 and 53. The conductors 1 and 2 in loop 50 are separated by a circle of PTFE insulator 3 and the conductors 1 and 2 in the loop 51 are similarly separated by a circle of PTFE insulator material 3. In a practical embodiment, the conductors 1 and 2 and insulator 3 in each of the loops 50 and 51 are pressed close together, and the linking strips 52 and 53 are close together, but not superimposed. the loops 50 and 51 are in practice arranged in a Helmholtz coil configuration with the loops 50 and 51 circular and spaced apart along a common axis. The axial spacing of the two loops being substantially equal to the mean radius of the loops.

Connection means for connecting the transmission line 40 to a matching and tuning network such is shown in FIG. 3, comprise first connection means 38 for conductor 1 (for example a terminal), and second connection means 39 for conductor 2 (for example a terminal). Thus the connection means 38,39 is provided at a junction between the two loops 50 and 51, the junction being provided by the linking strips 52 and 53.

In conformity with the nomenclature used in FIG. 3, the loop 50 is indicated as having one end at 42 and an opposite end at 43. Similarly the loop 51 is indicated as having one end at 42' and having another end at 43'. With reference to these ends, there will now be described the manner in which the connection means 38 and 39 are provided at the ends of the loops 50 and 51, in the sense of being electrically connected to these ends. The arrangement is such that the first connection means 38 for the first conductor 1 is provided at one end 42 of the loop 50, and the second connection means 39 for the second conductor 2 is provided at the other end 43 of the loop 50. The arrangement is also such that the first connection means 38 for the first conductor 1 is provided at one end 42' of the other loop 51, and the second connection means 39 for the second conductor 2 is provided at the other end 43' of the said other loop 51.

When the conductors 1, and 2 are assembled in practice, the cross-section of each part is as shown in FIG. 5. An alternative assembly embodying the principle of FIG. 7 consists of two parts each as shown in FIG. 4, linked in the same way as in FIG. 7.

FIGS. 8 and 9 show a further embodiment of a transducer according to the invention. FIG. 8 shows diagrammatically a pair of loops indicated generally at 60 and 61, wrapped around a former 69. The loops 60 and 61 are shown in developed form in FIG. 9. The loops consist again of two conductors 1 and 2 separated by an insulator 3 and there are provided first and second connection means 38 and 39 positioned on linking strips 63 and 62 of the conductors 1 and 2. The arrangement is another example of two parts in parallel to give a more uniform RF magnetic field than that of a single part. Functionally the arrangement can be considered as a distorted version of the coils shown in FIG. 7, which have been wrapped around the outside of the former 69, which in this case is a hollow cylinder. In this particular example the arc lengths around the cylinder are 120°, the length along the axis having been chosen to fulfil other requirements for satisfactory operation. The strip widths of the conductors 1 and 2 insulator 3 are shown in step form for the sake of clarity, but in practice the widths would be as shown in FIG. 5.

It is to be appreciated that in addition to use in the NMR spectrometer field, a transducer embodying the invention finds applications in other fields, for example rf broadcasting, and rf induction furnaces.

I claim:

1. A radio frequency transducer comprising a radio frequency transmission line formed in configuration including at least one loop, said transmission line comprising at least first and second elongate conductors spaced by dielectric material, the first and second conductors taking the form of strips of conducting laminate provided on opposite sides of a dielectric panel.

connection means adapted for connecting the transmission line to a radio frequency source or receiver, the connection means comprising first connection means for the said first conductor and second conduction means for the said second conductor, the connection means for the first conductor being provided at one end of the loop and the connection means for the second conductor being provided at the other end of the loop.

2. A transducer according to claim 1 wherein said transducers forms part of a probe assembly for a nuclear magnetic resonance spectrometer, said probe assembly including said transducer, a second radiofrequency transmission line, means for connecting the probe assembly to said second radiofrequency transmission line, said second transmission line adapted for providing a connection to a spectrometer, and means including a variable capacitor for tuning and matching the probe assembly to the second radiofrequency transmission line.

3. A transducer according to claim 1 incorporated in a nuclear magnetic resonance spectrometer.

4. A method of using a radiofrequency transducer according to claim 1 to obtain a nuclear magnetic resonance spectrum, which method involves applying an r.f. magnetic field to a sample by means of said at least one loop of said transducer.

5. A nuclear magnetic resonance probe assembly, comprising:

a radio frequency transducer for generating and detecting radio frequency magnetic fields, said transducer including a radio frequency coil formed in a configuration including at least one loop, said coil comprising over at least a portion of said loop a first radio frequency transmission line having a dielectric material and at least first and second elongate conductors spaced by said dielectric material to cause a substantially uniform self-capacitance in said transmission line to reduce the inductive impedence of the loop geometry, a second radio frequency transmission line adapted for connecting said transducer to a radio frequency source or receiver of a nuclear magnetic resonance spectrometer, connection means connecting said transdcuer to said second radio frequency transmission line, said connection means including first connection means for said second conductor, said connection means for said first conductor being provided at one end of said loop and said connection means for said second conductor being provided at the other end of said loop, and tuning means for tuning and matching said transducer to said second radio frequency transmission line.

6. A nuclear magnetic resonance probe assembly, comprising:

a radio frequency transducer for generating and detecting radio frequency magnetic fields, said transducer including a first radio frequency transmission line formed in a configuration including at least one loop, said first transmission line including a dielectic material and at least first and second elongate conductors spaced by said dielectric material to cause a substantially uniform self-capacitance in said first transmission line to reduce the inductive impedance of the loop geometry.

a second radio frequency transmission line adapted for connection to a radio frequency source or receiver of a nuclear magnetic resonance spectrometer, connection means connecting said transducer to said second radio frequency transmission line, said connection means including first connection means for said first conductor and second connection means for said second conductor, said connection means for said first conductor being provided at one end of said loop and said connection means for said second conductor being provided at the other end of said loop, and tuning means for tuning and matching said transducer to said second radio frequency transmission line.

7. A probe assembly according to claim 6 in which in said at least one loop at least one of the conductors has a connection means coupled to it at one end of the loop and has an open circuit at the other end of the loop.

8. A probe assembly according to claim 6 in which in said at least loop at least one of the conductors has a connection means coupled to it at one end of the loop and has a selectively variable impedance component at the other end of the loop.

9. A probe assembly according to claim 6 in which the first transmission line is formed in a configuration including two connected loops, the said connection means being provided at a junction between the two loops, the arrangement being such that the first connection means for the first conductor is provided at one end of one loop and the second connection means for the second conductor is provided at the other end of the said one loop, the arrangement also being such the the first connection means for the first conductor is provided at one end of the other loop, and the second connection means for the second conductor is provided at the other end of the said other loop.

10. A probe assembly according to claim 6 in which the first transmission line is formed with two loops arranged in a Helmholtz coil configuration with the loops approximately circular and spaced apart along a common axis, the axial spacing of the two loops being substantially equal to the mean radius of the loops.

11. A probe assembly according to claim 6 in which at least one loop is a substantially complete loop with the said ends of the loop in close proximity to each other and with the said connection means for the conductors of the loops in close proximity to each other.

12. A probe assembly according to claim 6 in which said first transmission line comprises first, second and third elongate conductors spaced by dielectric material, said first connection means being connected to said first and third elongate conductors.

13. A probe according to claim 6, wherein the dielectric material comprises polytetrafluoroethylene.

14. A probe assembly according to claim 6, wherein the dielectric is glass-reinforced polytetrafluoroethylene.

15. A probe assembly according to claim 6, wherein each of the said conductors is a copper strip, and the connection means comprise the projecting ends of the strip at opposite ends of the loop.

16. A probe assembly according to claim 6, wherein the first and second conductors take the form of strips of conducting laminate provided on opposite sides of a dielectric panel.

17. A probe assembly according to claim 6, wherein the said conductors and dielectric material are substantially uniform, whereby the distribution of capacitance around the loop is substantially uniform.

* * * * *